(12) United States Patent
Hancock et al.

(10) Patent No.: US 7,561,465 B2
(45) Date of Patent: Jul. 14, 2009

(54) METHODS AND SYSTEMS FOR RECOVERING DATA IN A NONVOLATILE MEMORY ARRAY

(75) Inventors: Bryan William Hancock, Los Altos, CA (US); Nicholas H. Tripsas, San Jose, CA (US); Richard C. Blish, II, Saratoga, CA (US)

(73) Assignees: Advanced Micro Devices, Inc., Austin, TX (US); Spansion LLC, Sunnyvale, CA (US)

( * ) Notice: Subject to any disclaimer, the term of this patent is extended or adjusted under 35 U.S.C. 154(b) by 97 days.

(21) Appl. No.: 11/724,774

(22) Filed: Mar. 16, 2007

(65) Prior Publication Data

US 2008/0175054 A1 Jul. 24, 2008

Related U.S. Application Data

(60) Provisional application No. 60/877,478, filed on Dec. 28, 2006.

(51) Int. Cl.
*G11C 16/06* (2006.01)
(52) U.S. Cl. ............ 365/185.09; 365/222; 365/185.03
(58) Field of Classification Search ............ 365/185.03, 365/185.09, 222
See application file for complete search history.

(56) References Cited

U.S. PATENT DOCUMENTS

| 6,151,246 | A | 11/2000 | So et al. |
|---|---|---|---|
| 6,731,557 | B2 | 5/2004 | Beretta |
| 7,099,221 | B2 | 8/2006 | Klein |
| 7,102,924 | B2 * | 9/2006 | Chen et al. ............. 365/185.09 |
| 2005/0073884 | A1 * | 4/2005 | Gonzalez et al. ....... 365/185.02 |
| 2008/0094914 | A1 * | 4/2008 | Park et al. ............. 365/185.24 |

* cited by examiner

*Primary Examiner*—Hoai V Ho
*Assistant Examiner*—Kretelia Graham
(74) *Attorney, Agent, or Firm*—Eschweiler & Associates, LLC

(57) ABSTRACT

One embodiment of the invention relates to a method for refreshing a nonvolatile memory array. In the method, a threshold voltage of a multi-bit memory cell is analyzed to determine if it has drifted outside of a number of allowable voltage windows, wherein each allowable voltage windows corresponds to a different multi-bit value. If the threshold voltage of the cell has drifted outside of the number of allowable voltage states, then the cell is recovered by adjusting at least one voltage boundary of at least one of the number of allowable voltage states.

10 Claims, 8 Drawing Sheets

METHODS AND SYSTEMS FOR RECOVERING DATA IN A NONVOLATILE MEMORY ARRAY

RELATED APPLICATION

This application claims priority to U.S. Provisional Application Ser. No. 60/877,478 filed Dec. 28, 2006, entitled "METHODS AND SYSTEMS FOR MEMORY DEVICES."

FIELD OF INVENTION

The present invention relates generally to semiconductor devices and more particularly to improved methods and systems for semiconductor non-volatile memories.

BACKGROUND OF THE INVENTION

Many different types of memory exist to store data for computers and other digital devices. Flash memory is one type of memory that has become popular because it combines the high density and low cost of EPROM with the electrical erasability of EEPROM. Flash memory can be rewritten and can hold its contents without power, and thus is nonvolatile. It is used in many portable electronic products, such as cell phones, portable computers, voice recorders, etc., as well as in many larger electronic systems, such as cars, planes, industrial control systems, etc.

Over time, flash memory as well as other types of memory can experience errors in data integrity due to any number of effects. For example, data stored as a "1"-state can be corrupted and go to a "0"-state, and vice versa. If left uncorrected, these errors can propagate through a system and lead to undesirable consequences. Therefore, a need has arisen to provide systems and methods relating to memory devices that can reduce and/or efficiently correct data errors.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment of the invention relates to a method for recovery of a nonvolatile memory array. In the method, a threshold voltage of a multi-bit memory cell is analyzed to determine if it has drifted outside of a number of allowable voltage windows, wherein each allowable voltage windows corresponds to a different multi-bit value. If the threshold voltage of the cell has drifted outside of the number of allowable voltage states, then the cell is refreshed by adjusting at least one voltage boundary of at least one of the number of allowable voltage states.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
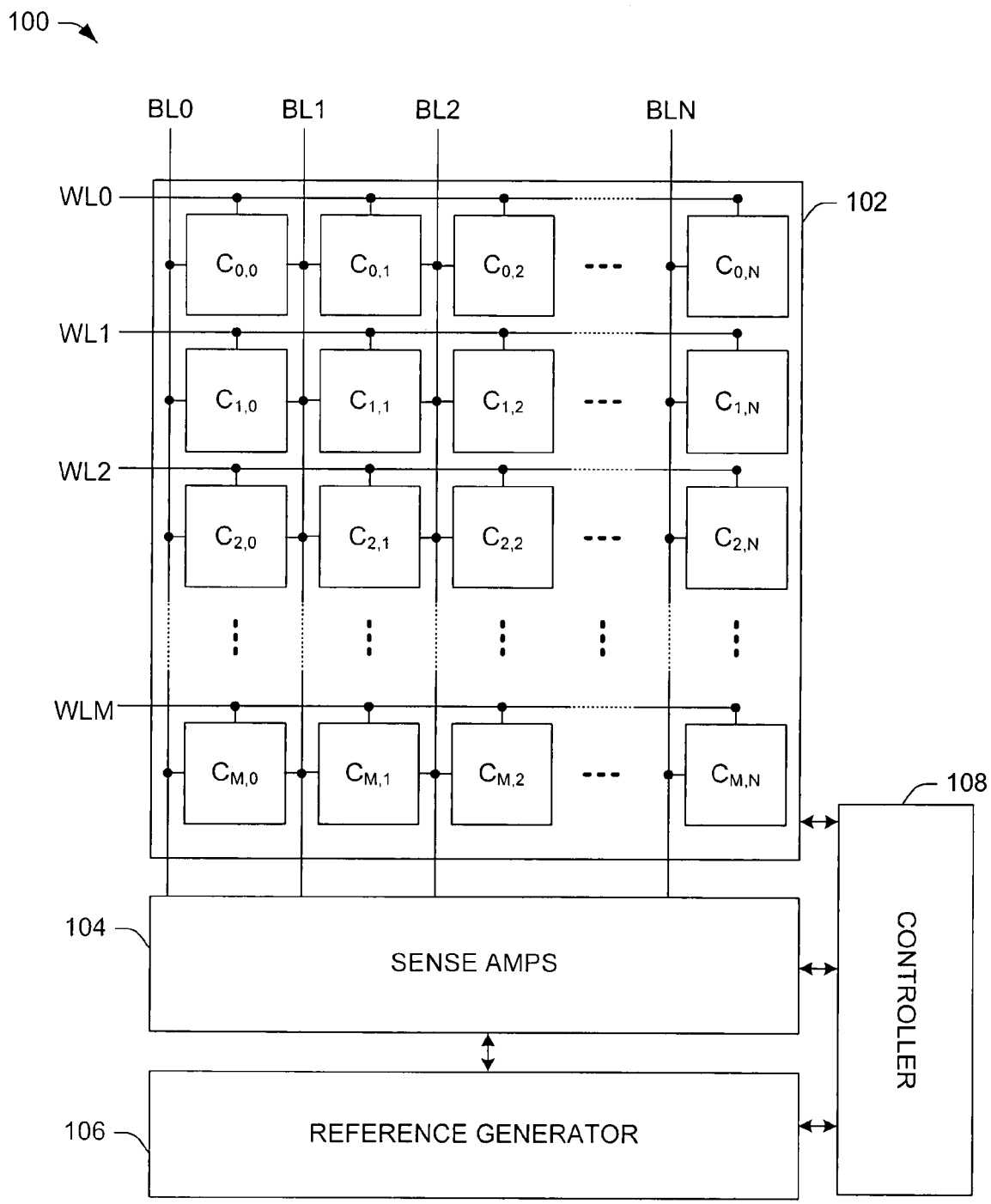
FIG. 1 shows one embodiment of a memory device.

One or more implementations of the present invention will now be described with reference to the attached drawings, wherein like reference numerals are used to refer to like elements throughout. The drawings are not necessarily drawn to scale.

Referring now to FIG. 1, one can see a memory device 100 in accordance with one embodiment of the present invention. The memory device 100 includes a memory array 102 that includes a number of memory cells that are each capable of storing one or more bits of data, depending on the implementation. Sense amps 104 associated with the cells provide read data by comparing voltages stored within the cells to a reference voltage which is provided by the reference generator 106. The device 100 also includes a controller 108 for providing control signals to drive the other components. In various embodiments, the controller 106 has suitable circuitry to compare the read data to expected data from the memory device. If the read data differs from the expected data, the memory device can automatically recover portions of the data stored in the device, for example, by adjusting the reference voltage provided by the reference generator. Thus, rather than correcting errors by merely adjusting a cell's voltage threshold, embodiments of the present invention may correct errors by adjusting the reference voltage. In various embodiments, the memory device 100 may also be configured to follow different procedures based on whether an error is due to charge gain or charge loss.

The illustrated memory array has cells arranged in M+1 rows (e.g., words) and N+1 columns (e.g., bits), indicated as $C_{ROW\text{-}COLUMN}$. Each column of cells is accessed via a pair of bitlines $BL_{COLUMN}$ and $BL_{COLUMN+1}$; for example, in the zeroth column of the device, the cells $C_{0,0}$ through $C_{M,0}$ form a column having M+1 bits that are positioned betweens bitlines BL0 and BL1. Each row of cells is an N+1 bit data word accessible via bitlines BL0 through BLN by activation of a wordline WL associated with that row. For example, in the zeroth row of the device 100, the cells $C_{0,0}$ through $C_{0,N}$ form an N+1 bit data word accessible via bitlines BL0 through BLN by activation of wordline WL0.

Typically, cell data is sensed during read operations using sense amps 104 respectively associated with columns 0 through N. More particularly, when a row of memory cells is to be read, the proper wordline is asserted and the cells are selectively biased, causing the bitlines to develop respective voltages that are proportional to the voltage threshold of the memory cells. The sense amps then perform a read operation by respectively comparing the bitline voltages to at least one reference voltage supplied by the reference generator. Depending on how the bitline voltages compare to the reference voltage(s), the sense amp can provide a combination of "0"s and "1"s that are associated with the individual memory cells within the row.

In various embodiments, the memory array 102 can comprise flash memory cells, such as single-bit flash memory cells, dual-bit flash memory cells, multi-bit flash memory cells (which include dual-bit flash memory cells). In other embodiments, the memory array could comprise EEPROM, EPROM, DRAM, or some other type of nonvolatile or volatile memory cells.

Figure 2:
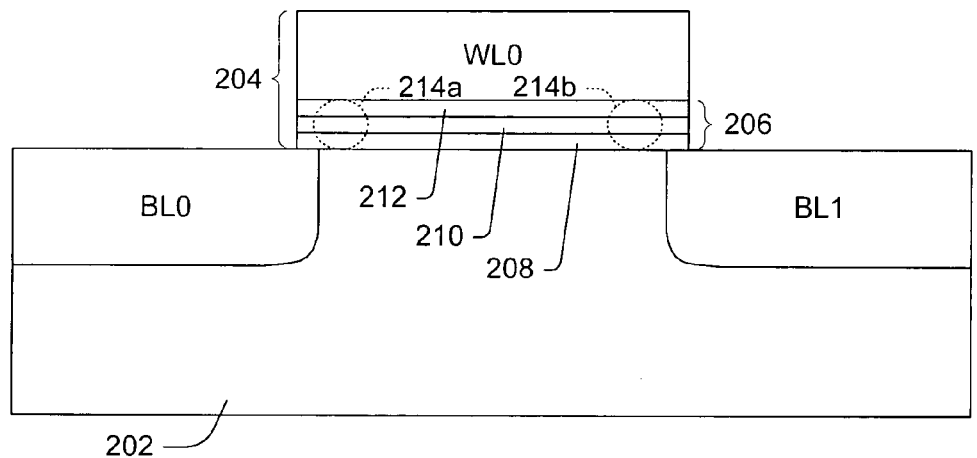
FIG. 2 shows one embodiment of a dual-bit (Dual Charge Location) memory cell.

In one embodiment, the memory array 102 comprises dual-bit flash memory cells, such as the dual-bit memory cell 200 shown in FIG. 2. The illustrated dual bit flash memory cell 200 can correspond to cell $C_{0,0}$ of FIG. 1. The illustrated dual bit memory cell is formed on or over a semiconductor substrate or p-well 202 and has N-type conductive bitlines BL0, BL1 that may interchangeably act as a source or drain. A channel region may exist under the wordline WL0 between the bitlines BL0, BL1.

A stacked gate structure 204, which may include a multi-level dielectric layer 206 and the wordline WL0, may be formed over the substrate 202. The multi-level dielectric layer 206 can generally be composed of three separate layers: a first insulating layer 208, a charge-trapping layer 210, and a second insulating layer 212. By suitably biasing the cell, the controller 108 can program or erase two bits 214a, 214b per cell by storing additional charge in the charge-trapping layer or by removing undesired charge from the charge-trapping layer. In either case, the change in charge will cause the threshold voltage of the cell to shift and is indicative of the value to be stored. Either bit of the memory cell can then be individually read.

For example, to read the left bit 214a of the memory cell, the controller 108 grounds the bitline BL0, and applies a constant voltage to BL1 (e.g., typically approximately 1-2 volts). Next, the reference generator 106 supplies a series of reference voltages to the wordline WL0. For each reference voltage applied to the word line during the read operation, the sense amp senses whether the memory cell conducts (e.g., the current through the cell exceeds a threshold value). Depending on the reference voltage sensed, the sense amp may determine that the left bit stores a "0"-value or "1"-value. The right bit could also be similarly read.

Figure 3:
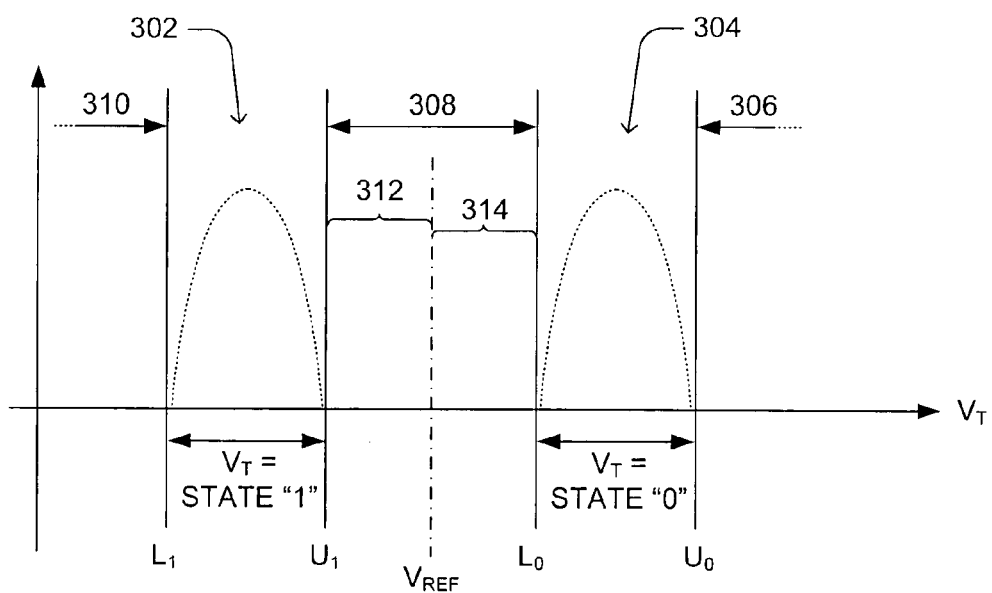
FIG. 3 shows one embodiment of a voltage distribution that relates to an array of dual-bit memory cells.

Because the memory cells themselves and the amount of charge stored therein may vary slightly across the array, the voltage thresholds can vary across the array. Thus, FIG. 3 shows a voltage threshold distribution 300 for a memory array of dual-bit memory cells, where there are two distinct allowable voltage windows 302, 304, one of which corresponds to a "1" state and the other of which corresponds to a "0" state, respectively. The allowable voltage windows 302, 304 are disposed about a reference voltage $V_{REF}$ that represents a voltage threshold of a reference memory cell, which is not in a "1" state or a "0" state. Ideally during a program or erasure operation, the threshold voltage of each memory cell has been set by adding or subtracting a predetermined amount of charge from the charge trapping regions 206, causing the voltage threshold of a given cell to fall within one of the allowable windows 302, 304. When the voltage thresholds of the cell are subsequently measured, they may tend to follow a bell-shaped distribution, where some of the measurements tend to be positioned the center of the allowable voltage windows and other measurements tend to be positioned near the edges of the allowable voltage window.

Disallowed voltage regions, which may also be referred to as error windows, flank the allowable voltage windows. More particularly, an upper error window 306 is found above an upper voltage boundary $U_0$ of the second allowable voltage window 304; a central error window 308 is found between a lower voltage boundary $L_0$ of the second allowable voltage window 304 and an upper voltage boundary $U_1$ of the first allowable voltage window 302; and a lower error window 310 is found below a lower voltage boundary $L_1$ of the first allowable voltage window 302. The reference voltage $V_{REF}$ is found somewhere within the central error window 308, although the reference voltage need not be centered within the central error window. First and second guard bands 312, 314, are respectively defined between the reference voltage $V_{REF}$ and the voltage boundaries $U_1$ and $L_0$ of the central error window 308.

In one embodiment the reference voltage $V_{REF}$ or one of the boundaries, either of which may relate to a group of cells within the memory array, can be dynamically adjusted to correct errors in the memory array. Thus, the reference voltage generator can be configured to provide an adjustable reference voltage that can slide the allowable voltage windows 302, 304 to higher or lower voltages to compensate for errors that occur within the array. Typically, errors could be caused by charge gain or charge loss within individual memory cells, which could cause the voltage threshold of an affected cell to drift from within one of the allowable voltage regions into one of the error voltage windows. Thus, rather than correcting errors by adjusting the voltage threshold as taught in the prior art, embodiments of the present invention may correct errors by adjusting the reference voltage $V_{REF}$ and/or by adjusting at least one of the voltage boundaries of the allowable voltage windows. Various embodiments of the present invention could also correct errors by adjusting the voltage threshold, for example by adding charge or removing charge from the charge trapping layer.

Figure 4:
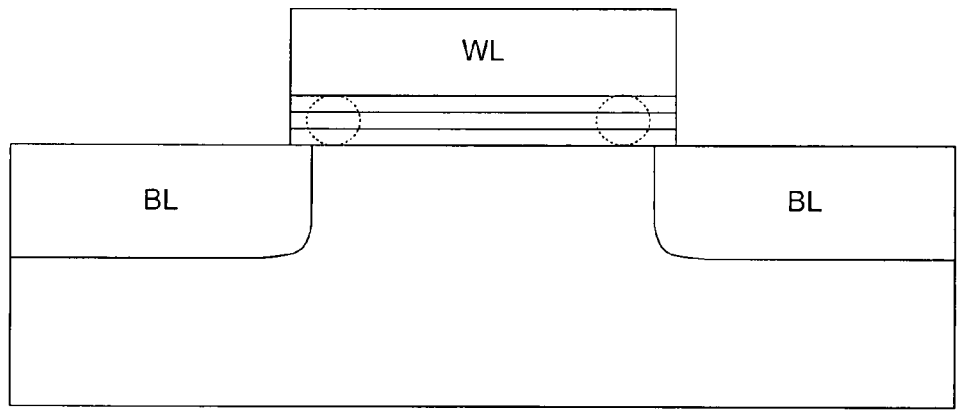
FIG. 4 shows one embodiment of a multi-bit memory cell.
Figure 5:
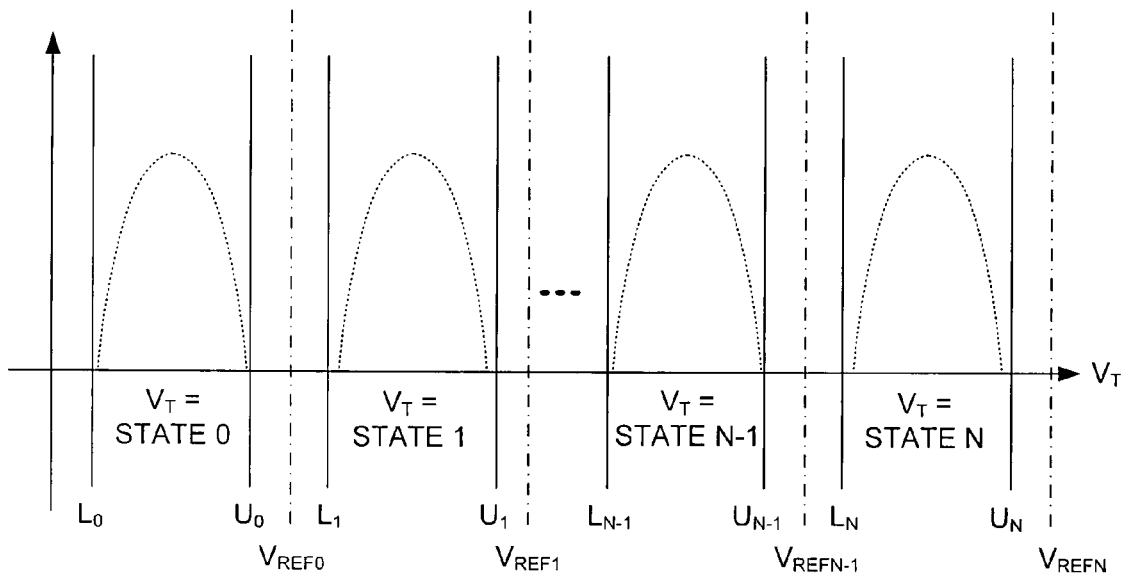
FIG. 5 shows one embodiment of a voltage distribution that relates to an array of multi-bit memory cells.

While one embodiment of a dual-bit memory cell is discussed for convenience and clarity, aspects of the present invention also relate to other multi-bit memory cells, such as quad-bit cells or even higher-order-bit cells. FIG. 4 shows a general embodiment of one type of multi-bit memory cell, wherein a range of threshold voltages are partitioned into a set of allowable windows that correspond to data values. FIG. 5 shows a voltage distribution of the multi-bit cell, which again shows one general scheme in which a range of voltage thresholds can be divided into a number of allowable voltage windows. Again, the allowable states are separated from one another by disallowed regions, in which adjustable reference voltages ($V_{REF1}, V_{REF2}, \ldots, V_{REFN}$) and guard bands (not shown) may be positioned.

In one embodiment, a threshold voltage of the multi-bit memory cell is analyzed to determine if it has drifted outside of the number of allowable voltage windows, wherein each allowable voltage window corresponds to a different multi-bit value. If the threshold voltage of the cell has drifted outside of the number of allowable voltage states, then the cell can be recovered by adjusting at least one voltage boundary of at least one of the number of allowable voltage states.

In order to further appreciate various aspects of the invention, an illustrative method will now be set forth below. Although the method is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated (e.g., device 100 in FIG. 1) and described herein as well as in association with other structures not illustrated. For example, although the schematic representations show a dual-bit flash memory cell as previous described, it will be appreciated that the aspects of the invention may also apply to single-bit flash memory cells, multi-bit flash memory cells, EEPROM, EPROM, or other types of non-volatile memory.

Figure 6:
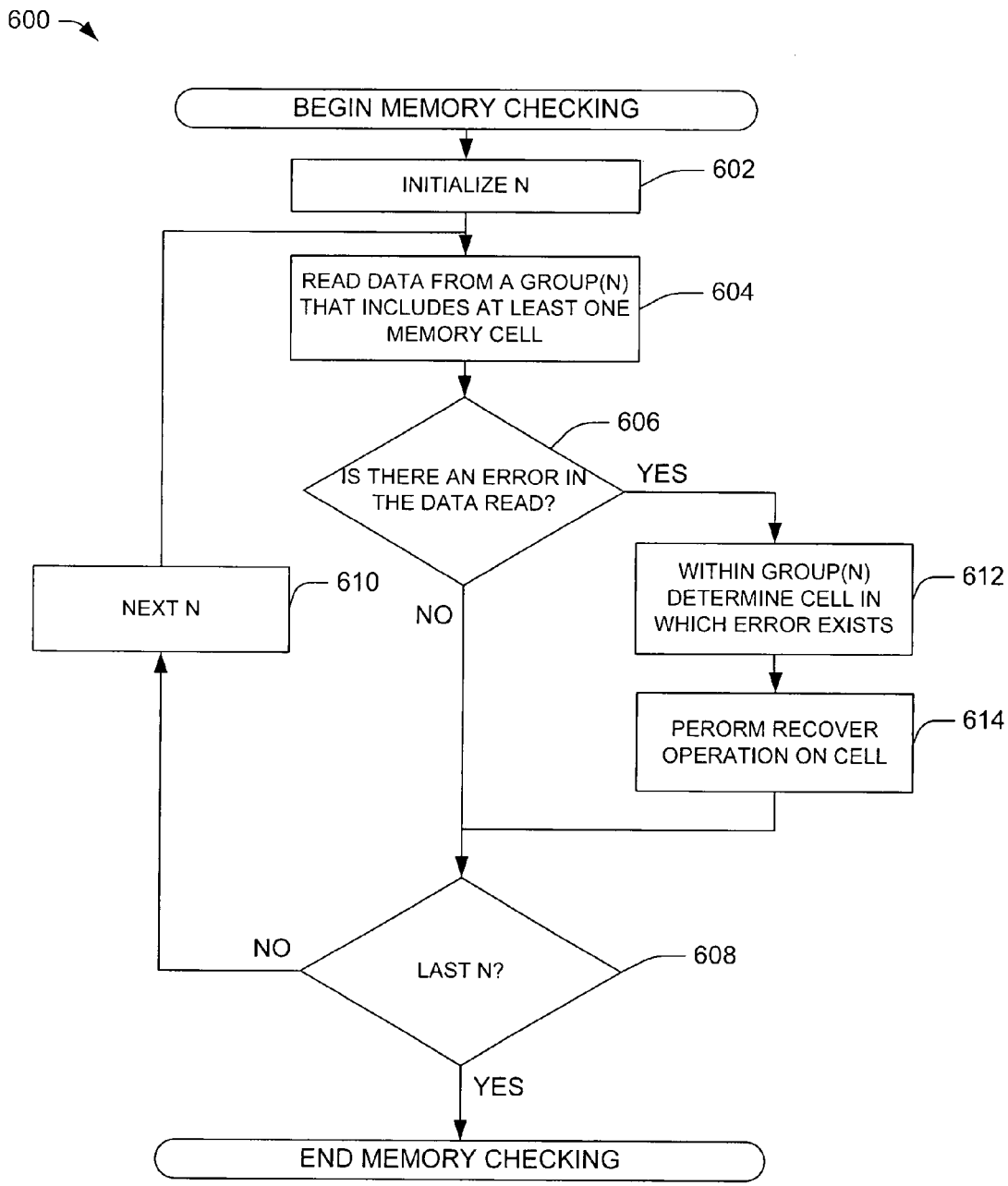
FIG. 6 shows one flowchart of a memory checking operation.

Referring now to FIG. 6, one can see one method 600 for performing a memory checking operation in accordance with aspects of the present invention. Typically, the memory checking operation moves from one group of memory cells (e.g., a sector) to another while checking the data within each group for errors. If the data within a group contains an error, then a refresh can be performed to correct the data. For example, in one embodiment at least one voltage boundary associated with the group can be adjusted to compensate for the error.

At block 602, the memory array or portions thereof have been divided into N groups, wherein N is any positive integer, and N is initialized. A group could be one or more bits, one or more bytes, one or more words, one or more sectors, one or more pages, or any other number of memory cells. In any event, at block 604, data is read from a group(N), which includes at least one memory cell.

At block 606 a determination is made as to whether the cell's data is corrupted. Thus, in block 606 the data actually read from the cell could be compared to expected data for the cell. The expected data could be generated, for example, by using error correcting code (ECC) or error detection and correction (EDAC), which are well-known techniques based on Hamming or Read-Solomon codes in which a redundant bits are added to a word such that a corrupted word with a single bit-error shows a pattern that unambiguously points to the single corrupted bit. These redundant bits could be stored, for example, in an off-chip memory device or in scratchpad sector with in the memory device.

If there are no errors in the data read ("NO" at 606), then the method 600 proceeds to block 608 and a determination is made if this is the last group(N) to be checked. If this is the last group to be checked ("YES" at 608), then the memory checking routine ends. However, if this is not the last group to be checked ("NO" at 608), then the method at 600 increments N at block 610 and returns to read data from another group(N) at 604.

If during the memory checking routine 600 an error is found ("YES" at 606), the method proceeds to 612 and determines which cell contains corrupted data. The identification of the corrupted cell can be facilitated by ECC or EDAC as mentioned. Once the corrupted cell has been identified, a refresh operation can be performed on the cell in block 614 to correct the data therein.

Figure 7:
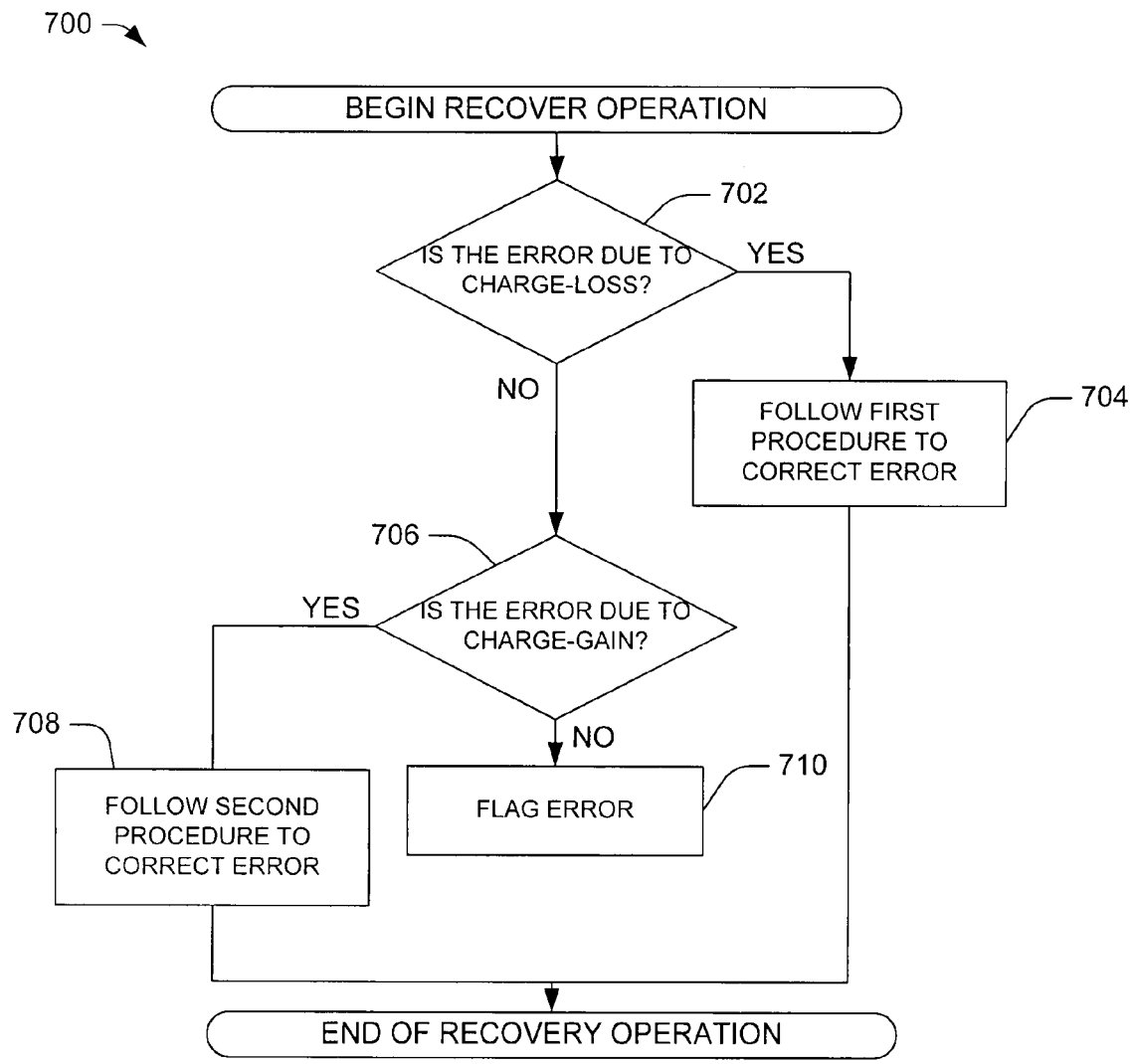
FIG. 7 shows one flowchart of a memory recovery operation.

Referring now to FIG. 7, one can see one refresh operation 700 in accordance with aspects of the present invention. The refresh operation 700 begins at 702 where a determination is made whether the error is due to charge loss. If so ("YES" at 702), the refresh operation follows a first procedure to correct the error in block 704. If not ("NO" at 702), a determination is made in block 706 as to whether the error is due to charge gain. If the error is due to charge gain ("YES" at 706), the refresh operation 700 follows a second procedure to correct the error at block 708. Otherwise ("NO" at 706) an error can be flagged at block 710 and the device can take appropriate action.

Figure 8:
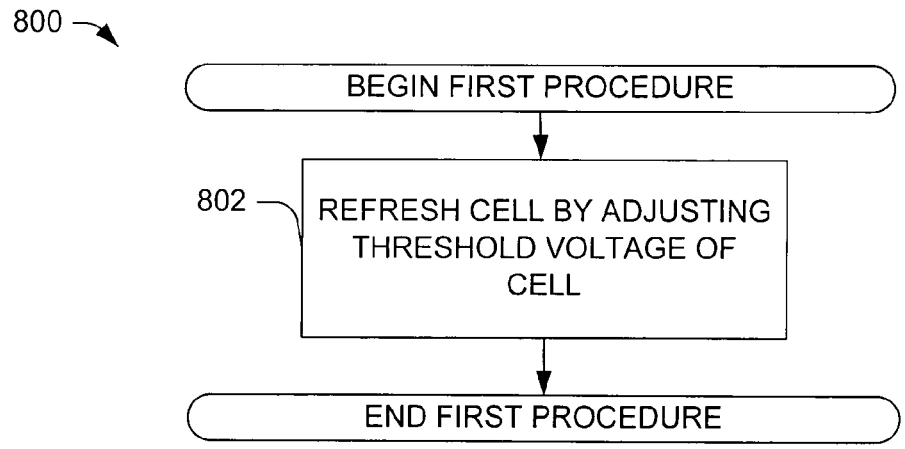
FIG. 8-8A shows a flowchart and schematic representation of a procedure to correct an error.
Figure 8A:
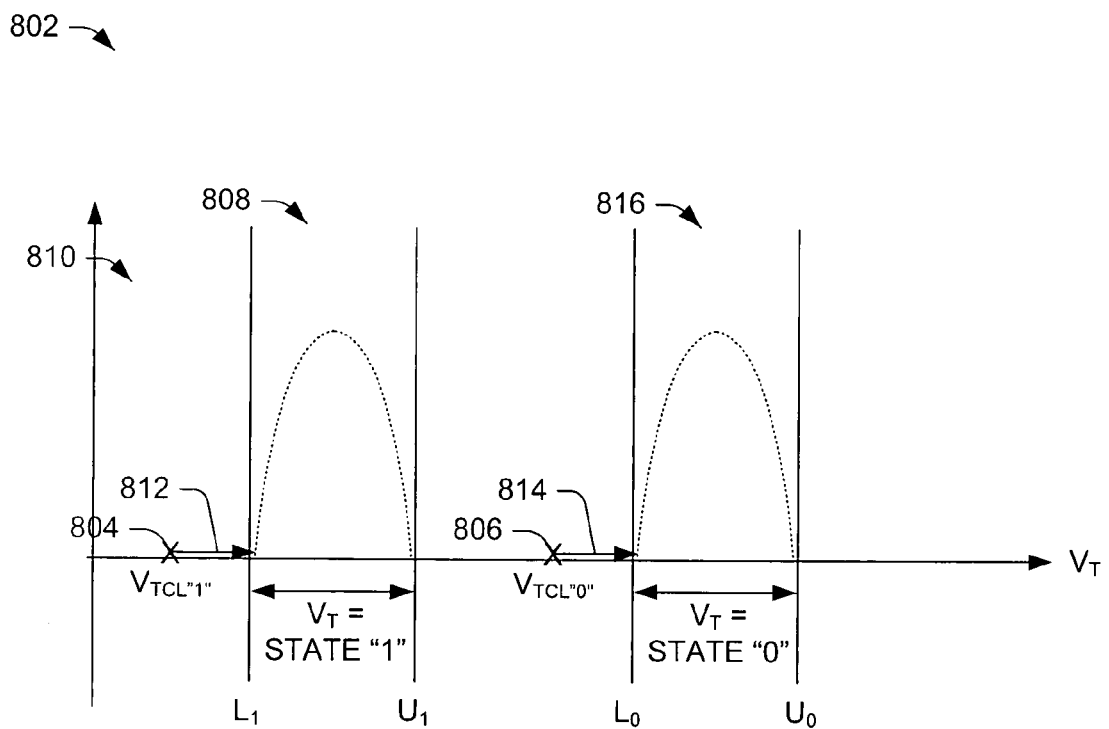

FIG. 8 shows one embodiment of the first procedure 800 to correct data errors due to charge loss. As shown, during the first procedure 800, a memory device can recover the cell by adjusting the threshold voltage of the cell in block 802. Thus, the first procedure may add additional charge or remove unwanted charge from a charge trapping layer of a corrupted memory.

This is shown conceptually in FIG. 8, which shows two possible voltage threshold measurements 804, 806 due to charge loss. The first voltage measurement 804 ($V_{T\ charge\ Loss\ "1"}$) could occur if charge has leaked off of the charge trapping layer, and causes the voltage threshold measurement 804 of the cell to drift out of the first allowable voltage window 808 past the voltage boundary $L_1$ and into the error region 810. During the first procedure 800, the data in the corrupted cell may be corrected by biasing the cell to add additional electrons to the charge trapping layer or subtract holes from the charge trapping layer. Thus, the first voltage threshold 804 can be shifted back upwards 812 across the lower boundary voltage $L_1$ into the first allowable voltage window 808. Similarly, the second voltage threshold 806 ($V_{T\ charge\ Loss\ "0"}$) can be shifted back upwards 814 across the lower boundary voltage $L_0$ into the second allowable voltage window 816.

Figure 9:
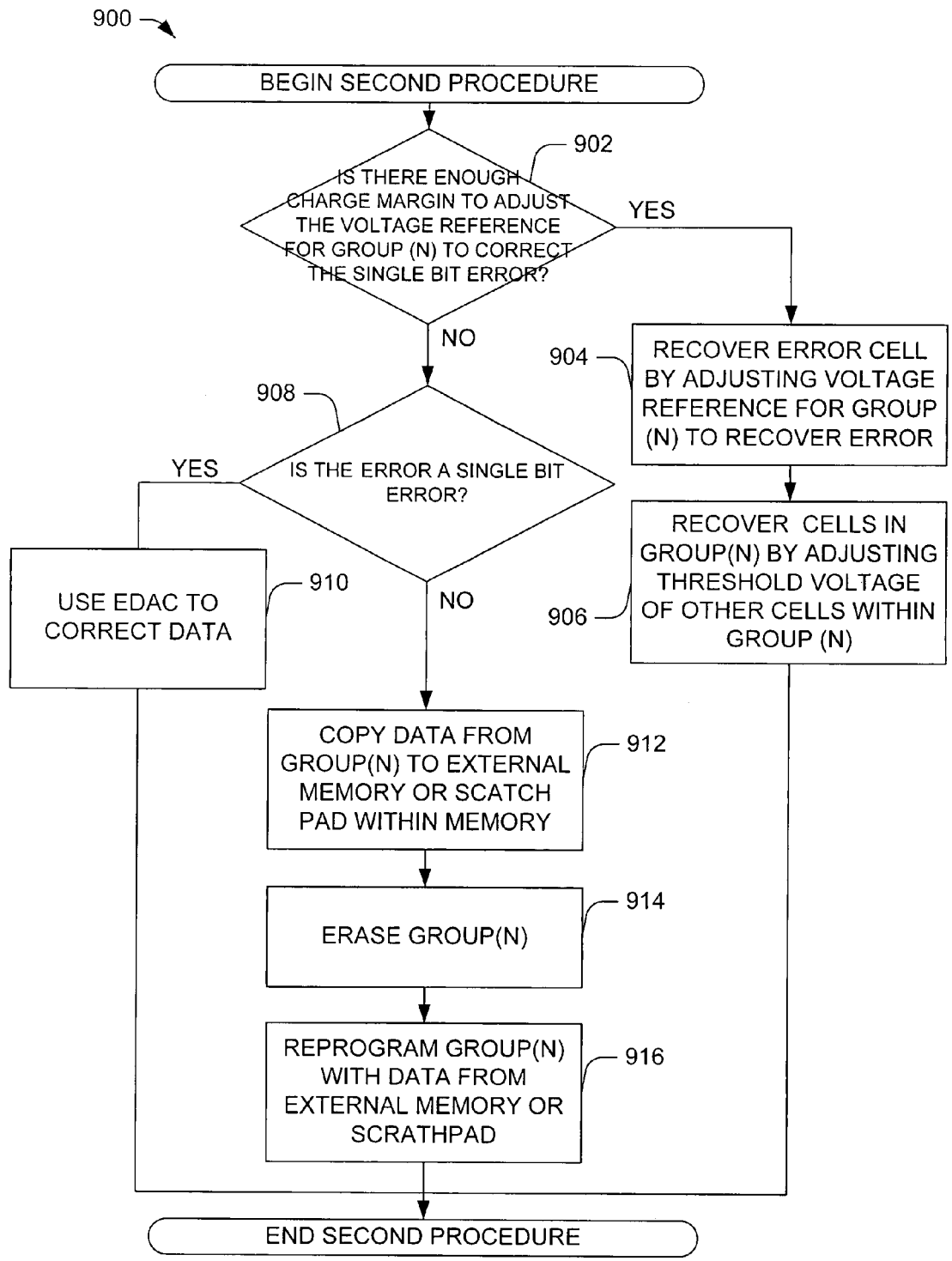
FIGS. 9, 9A, and 9B show a flowchart and schematic representations of a second procedure to correct an error.

FIG. 9 shows one embodiment of the second procedure 900 that can correct charge gain errors. Notably the second procedure 900 may differ from the first procedure 800, as charge gain errors may be more difficult to correct than charge loss errors. Accordingly, the two procedures can be treated differently. The second procedure 900 begins at 902 when a determination is made whether there is enough charge margin to adjust a reference voltage for the group (N) to correct the error.

Figure 9A:
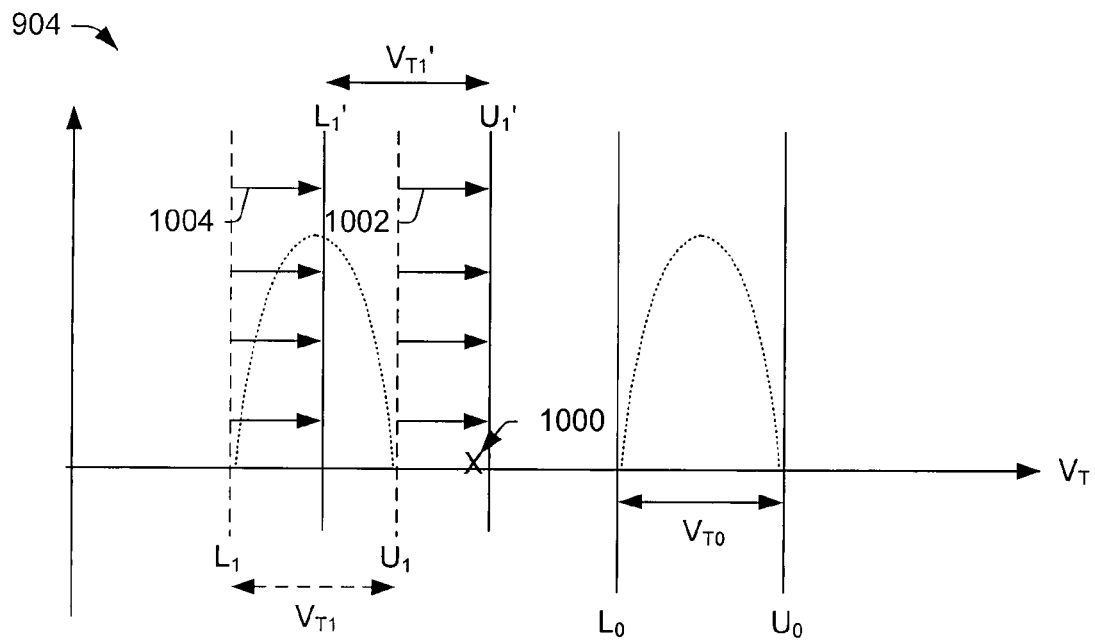
Figure 9B:
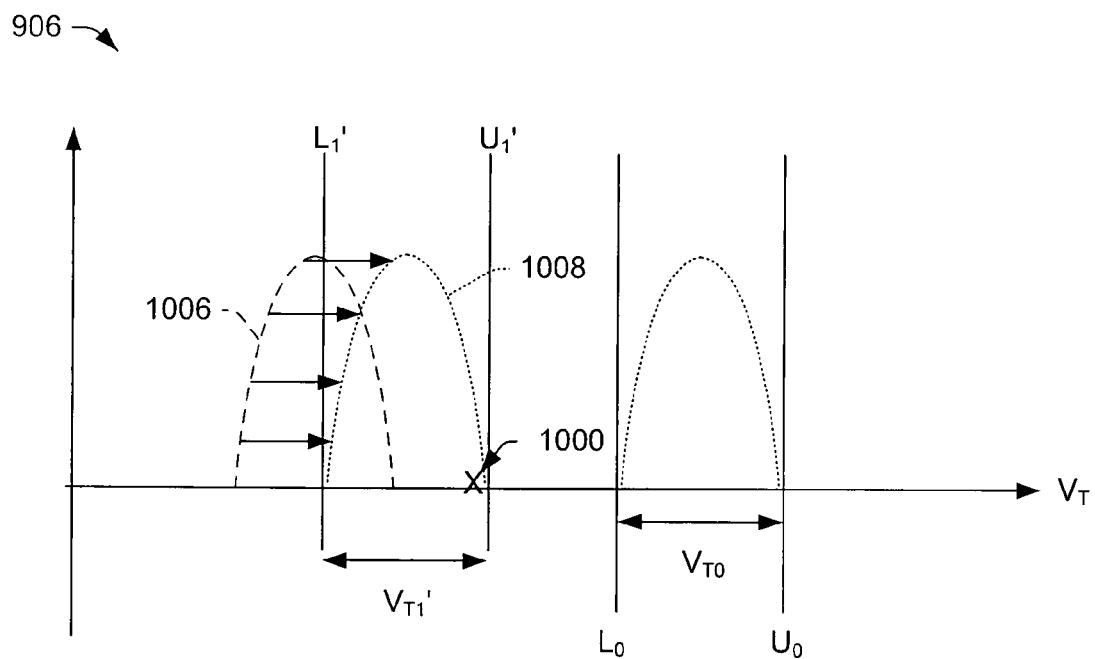

If there is enough charge margin to safely adjust the reference voltage for the group(N) ("YES" at 902), the second procedure 900 proceeds to block 904 where the cell is refreshed by adjusting the reference voltage or a voltage boundary for the group(N). As shown in FIG. 9A, a corrupted cell could have a voltage threshold 1000 ($V_{T\ Charge\ Gain\ "1"}$) due to too many electrons (or too few holes) being stored on the charge trapping layer. In the illustrated embodiment, the allowable voltage window $V_{T1}$ is adjusted to accommodate the voltage threshold of the charge gain error 1000. More particularly, the voltage boundary $U_1$ is adjusted upwards 1002 to $U_1'$, such that the measured voltage threshold 1000 will fall within an adjusted allowable voltage window $V_{T1}'$. As shown, the other voltage boundary $L_1$ may also be adjusted upwards 1004 to $L_1'$. While these adjustments bring the corrupted cell within the allowable voltage window $V_{T1}'$, it may also cause the other cells in the group(N) to fall outside of the this new voltage window $V_{T1}'$ To remedy this effect, the other cells are further recovered by adjusting their threshold voltages in block 906 (FIG. 9). This block is illustrated conceptually in FIG. 9B, where the charge level of the other cells 1006 in the first allowable voltage window are adjusted upwards 1008 into the new allowable voltage window $V_{T1}'$ positioned between $L_1'$ and $U_1'$. It will be appreciated that although FIGS. 9A-9B show both voltage boundaries $L_1$ and $U_1$ being adjusted, in other non-illustrated embodiments only one of the voltage boundaries could be moved. In still other embodiments, a voltage boundary could be moved by adjusting a reference voltage or one or more guard bands.

On the other hand, if there is not enough charge margin to safely adjust the reference voltage ("NO" at 902), the second procedure 900 makes a determination as to whether the error is a single bit error in 908. If the error is a single bit error ("YES" at 908), then EDAC could be used at block 910 to correct the data in the cell, for example, by using an XOR to flip the corrupted bit to restore the word to its proper pattern.

If the error is not a single bit error ("NO" at 908), then the second procedure 900 proceeds to block 912 wherein data is copied from the group(N) to an external memory or to a scratch pad within the memory device. At block 914 the group(N) is erased, after which the group(N) is reprogrammed with data from the data from the external memory or scratchpad in block 916.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method for recovering a nonvolatile memory array, comprising:
    analyzing whether a threshold voltage of an errant multi-bit memory cell has drifted outside of a number of initial allowable voltage windows, wherein each initial allowable voltage window corresponds to a different multi-bit value for non-errant cells of the array;
    if the threshold voltage of the errant cell has drifted outside of the number of initial allowable voltage windows, then adjusting at least one voltage boundary of at least one of the number of initial allowable voltage windows to form a subsequent allowable voltage window, where the voltage threshold of the errant cell falls within the subsequent allowable voltage window and voltage thresholds of at least some non-errant cells fall outside the subsequent allowable voltage window; and
    after forming the subsequent allowable voltage window, adjusting the threshold voltages of the at least some non-errant cells to bring them into the subsequent allowable voltage window.

2. The method of claim 1, wherein the threshold voltages of the non-errant cells are adjusted to bring them into the subsequent allowable voltage window but outside at least a portion of the initial allowable voltage window.

3. The method of claim 1, wherein adjusting at least one voltage boundary is facilitated by adjusting at least one reference voltage that is positioned between two of the number of initial allowable voltage windows.

4. A method for refreshing a nonvolatile memory array, comprising:
    analyzing a group of at least one memory cell to determine if a threshold voltage of an errant cell within the group has drifted outside of at least one initial allowable voltage window associated with the group;
    if the threshold voltage of the errant cell has drifted outside the at least one initial allowable voltage window, adjusting at least one voltage boundary of the at least one initial allowable voltage window to establish at least one subsequent allowable voltage window that includes the threshold voltage of the arrant cell; and
    adjusting threshold voltages of non-errant cells in the group to fall within the at least one subsequent allowable voltage window.

5. The method of claim 4, wherein threshold voltages of the non-errant cells are adjusted after the at least one voltage boundary is adjusted.

6. The method of claim 4, wherein adjusting at least one voltage boundary causes other cells within the group to fall outside of the at least one initial allowable voltage window.

7. The method of claim 6, further comprising: recovering the other cells by adjusting their threshold voltages.

8. The method of claim 4, wherein the memory array comprises multi-bit memory cells and each allowable voltage window corresponds to a different multi-bit value.

9. A nonvolatile memory device comprising:
    an array of a multi-bit memory cells that are associated with number of allowable voltage windows, wherein each allowable voltage window corresponds to a different multi-bit value;
    a reference generator configured to provide an adjustable reference voltage;
    a sense amp associated with the multi-bit memory cells and configured to provide read data by comparing data stored within the cells to the adjustable reference voltage; and
    a controller configured analyze a group of memory cells in the away to determine if a threshold voltage of an arrant cell within the group has drifted outside at least one initial allowable voltage window associated with the group;
    wherein the controller is configured to adjust at least one voltage boundary of the at least one initial allowable voltage window to establish at least one subsequent allowable voltage window that includes the threshold voltage of the errant cell; and
    wherein the controller is configured to adjust threshold voltages of at least some non-errant cells in the group to fall within the at least one subsequent allowable voltage window.

10. The device of claim 9 wherein controller is further configured to refresh a cell by adjusting at least one voltage boundary related to the adjustable reference voltage.

* * * * *

UNITED STATES PATENT AND TRADEMARK OFFICE
CERTIFICATE OF CORRECTION

| | | |
|---|---|---|
| PATENT NO. | : 7,561,465 B2 | Page 1 of 1 |
| APPLICATION NO. | : 11/724774 | |
| DATED | : July 14, 2009 | |
| INVENTOR(S) | : Bryan Williams et al. | |

It is certified that error appears in the above-identified patent and that said Letters Patent is hereby corrected as shown below:

Column 8, Claim 9, line 41; please replace "away" with --array--

Signed and Sealed this

Eighteenth Day of August, 2009

David J. Kappos
*Director of the United States Patent and Trademark Office*